United States Patent [19]

Douglas

[11] Patent Number: 5,279,702
[45] Date of Patent: Jan. 18, 1994

[54] ANISOTROPIC LIQUID PHASE PHOTOCHEMICAL COPPER ETCH

[75] Inventor: Monte A. Douglas, Coppell, Tex.

[73] Assignee: Texas Instruments Incorporated, Dallas, Tex.

[21] Appl. No.: 954,087

[22] Filed: Sep. 30, 1992

[51] Int. Cl.$^5$ .......................... C23F 1/00; B44C 1/22
[52] U.S. Cl. ................... 156/635; 156/643; 156/656; 156/659.1; 156/666; 156/901
[58] Field of Search ............ 156/635, 643, 656, 659.1, 156/666, 901, 902

[56] References Cited

U.S. PATENT DOCUMENTS

| | | | |
|---|---|---|---|
| 4,391,683 | 7/1983 | Buckley et al. | 204/129.3 |
| 4,414,066 | 11/1983 | Forrest et al. | 204/129.3 |
| 4,415,414 | 11/1983 | Burton et al. | 204/129.3 |
| 4,904,340 | 2/1990 | Miracky et al. | 156/902 X |
| 5,100,499 | 3/1992 | Douglas | 156/635 |
| 5,157,000 | 10/1992 | Elkind et al. | 437/225 |
| 5,165,283 | 11/1992 | Kurtz et al. | 73/727 |
| 5,201,989 | 4/1993 | Douglas et al. | 156/635 |

OTHER PUBLICATIONS

Toyama, et al., "Crack-Free PZT Thin Films Micropatterned on Silicon Substrate for Integrated Circuits", (abstract) Seiko Instruments Inc.

Watton, et al., "Materials and Technology Research in Uncooled Ferroelectric IR Detector Arrays", *Royal Signals and Radar Establishment, U.K.*, pp. 69–77.

Kauffman, et al., "Studies of Reactions of Atomic and Diatomic Cr, Mn, Fe, Co, Ni, Cu, and Zn with Molecular Water at 15K", *Journal of Physical Chemistry*, vol. 89, No. 16, pp. 3541–3547, 1985.

Park, et al., "Reactions and Photochemistry of Atmoic and Diatomic Nickel with Water at 15 k", *High Temperature Science*, pp. 1–15, vol. 25, 1988.

Hauge, et al., "Matrix Isolation Studies of the Reactions of Metal Atoms with Water", *High Temperature Science Inc.*, pp. 338–339, 1981.

Kauffman, et al., "Infrared Matric Isolation Studies of the Interactions of Mg, Ca, Sr, and Ba Atoms and Small Clusters with Water", *High Temperature Science*, pp. 97–118, vol. 18, 1984.

Douglas, et al., "Matrix Isolation Studies by Electronic Spectroscopy of Group IIIA Metal-Water Photochemistry", *J. Chem. Soc., Faraday Trans. 1*, pp.1533–1553, 79, 1983.

Douglas, et al., "Electronic Matrix Isolation Spectroscopic Studies of the Group IIA Metal-Water Phototochemistry", *High Temperature Science*, pp. 201–235, vol. 17, 1984.

*Primary Examiner*—William A. Powell
*Attorney, Agent, or Firm*—Chris D. Pylant; Richard A. Stoltz; James C. Kesterson

[57] ABSTRACT

A copper substrate 30 is immersed in a liquid 34 (e.g. 0.1 molar concentration hydrochloric acid) and illuminated with collimated radiation 24 (e.g. collimated visible/ultraviolet radiation) produced by a radiation source 20 (e.g. a 200 Watt mercury xenon arc lamp). A window 26 which is substantially transparent to the collimated radiation 24 allows the radiated energy to reach the copper substrate 30. An etch mask 32 may be positioned between the radiation source 20 and the substrate 30 (preferably the mask is also in the liquid). The copper substrate 30 and liquid 34 may be maintained at a nominal temperature (e.g. 25° C.). Without illumination, the copper is not appreciably etched by the liquid. Upon illumination the etch rate is substantially increased. A further aspect is the addition of a passivant (e.g. iodine) to the liquid which forms a substantially insoluble passivation layer 36 on the substrate which is removed or partially removed by the radiation 24. Sidewalls 40 are protected from the etchant by vertical passivation layers 42, further increasing the difference between the illuminated and unilluminated etch rates.

24 Claims, 1 Drawing Sheet

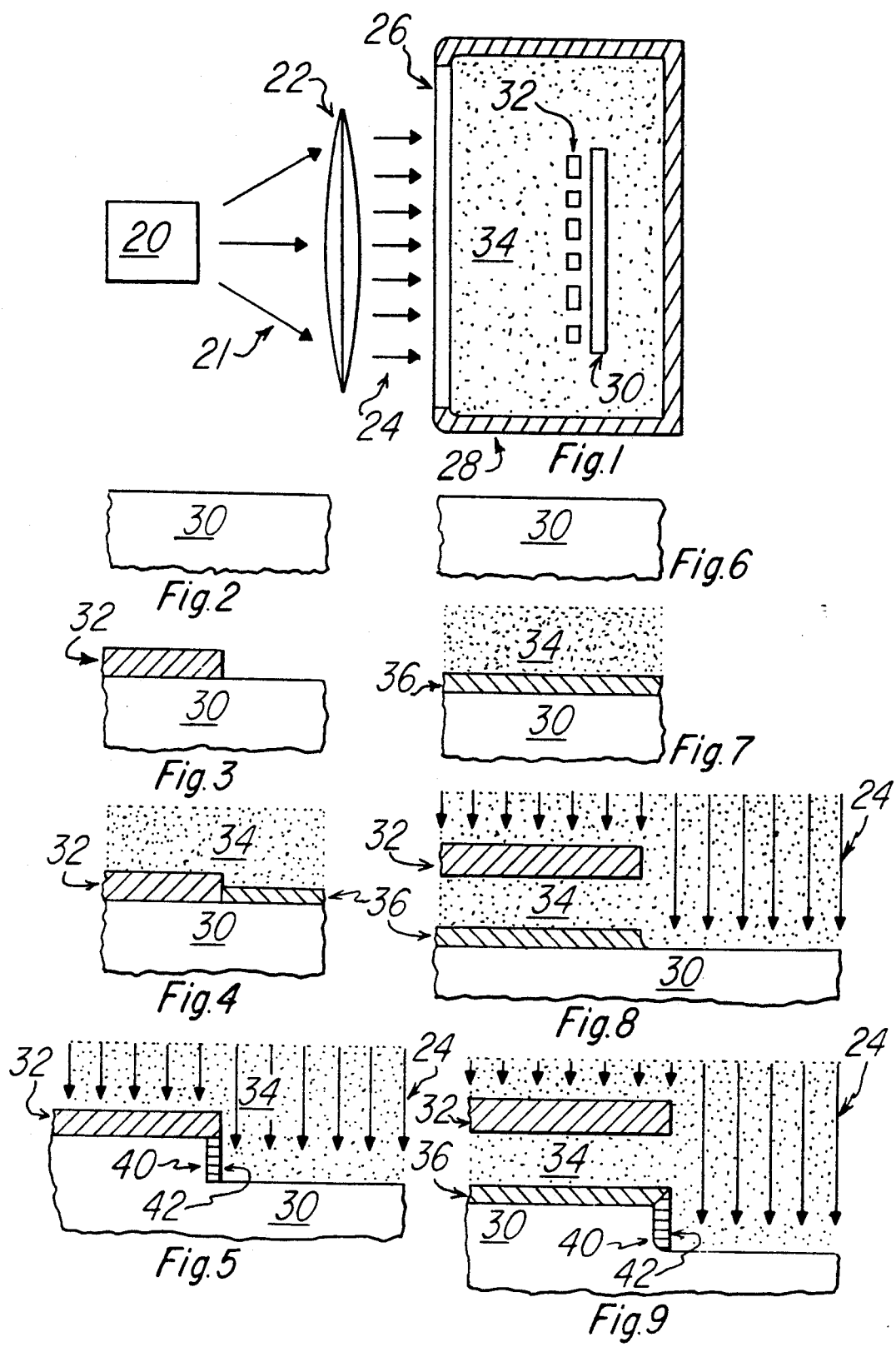

ANISOTROPIC LIQUID PHASE PHOTOCHEMICAL COPPER ETCH

CROSS-REFERENCE TO RELATED APPLICATIONS

The following related applications were filed concurrently with the instant application:

| Title | Inventor | Serial Number/Status |
| --- | --- | --- |
| Anisotropic Liquid Phase Photochemical Mercury Cadmium Telluride Etch | Douglas | 07/954,130/Pending Application |
| Anisotropic Liquid Phase Photochemical Etch Method | Douglas | 07/954,131/Pending Application |

FIELD OF THE INVENTION

This invention generally relates to the fabrication of integrated circuits, and particularly to etch process technology.

BACKGROUND OF THE INVENTION

Without limiting the scope of the invention, its background is described in connection with current methods of etching copper.

It has long been known that copper is an excellent metal for use in integrated circuit metallization. Copper exhibits low corrosion, low electromigration and high conductivity. However, copper is not currently easily integrated into integrated circuit fabrication process flows.

Heretofore, in this field, copper has been patterned in a variety of ways. Copper may be plasma etched using a chlorine based etch chemistry at highly elevated temperatures. Ion milling or magnetron etching with argon or chlorine reagents have been somewhat successfully used to pattern copper. Lift-off techniques have been used to pattern copper metal features. Wet chemical etching of copper is also known, as well as dry etching with activated gaseous reagents. Etching can be avoided by selectively eletroplating a copper film onto predisposed regions of a substrate.

SUMMARY OF THE INVENTION

It has been discovered that current methods of patterning copper are not ideal. For instance, plasma etching of copper with halides (e.g. chlorine) can be difficult because copper does not form a copper halide compound that has a sufficiently high vapor pressure at low temperatures (typically 50° C. to 100° C.). At higher temperatures, plasma etching can cause contamination of reactor walls, severe etch isotropy and etch mask degradation. Additionally, plasma etching can lead to reduced parts yield, reliability problems and device performance degradation due to temperature and electric field effects. Ion or magnetron milling with argon or chlorine is merely a sputter removal, resulting in similar contamination and device degradation. Conventional wet etching is inherently isotropic and is only useful for patterning features which are much larger than those required for fabrication of today's integrated circuit devices and especially of VLSI devices. Electroplating and selective deposition on predisposed regions requires a corrosive environment that may compromise device characteristics.

Generally, and in one form of the invention, patterning of copper is accomplished by immersing it in a liquid and then exposing it to electromagnetic radiation, causing illuminated portions of the copper to be etched and unilluminated portions to remain substantially unetched. The process presented is therefore an anisotropic liquid phase photochemical copper etch. Preferably, copper is etched by immersing it in hydrochloric acid and illuminating it with visible and ultraviolet radiation provided by a mercury/xenon arc lamp. Preferably, an etch mask is used to define the pattern of illumination at the surface and thereby define the etch pattern. The highly directional nature of light makes this an anisotropic etch method. A further aspect of this invention is the addition of a chemical passivant such as iodine to the liquid which protects sidewalls from the etchant, further increasing the difference between the illuminated and unilluminated etch rates. While halides are considered etchants in other patterning techniques, iodine acts as a passivant in this case.

This is apparently the first copper etch method to make use of electronic excitation caused by photo-irradiation in a reaction between copper and a liquid (e.g. hydrochloric acid). The invention gives many advantages. A major advantage of the invention is that it is anisotropic (i.e. does not cause substantial undercut). Those regions under the mask remain in shadow and are not appreciably etched. In addition, it has been found that this method does not cause unacceptable defects in the copper. Contamination from plasma species is prevented. Generally, no high temperature anneal is required.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings.

In the drawings:

FIG. 1 is a representation of the apparatus and materials used to anisotropically etch copper.

FIGS. 2–5 are microscopic cross sections of a copper substrate undergoing liquid phase photochemical etching which depict the function of etch passivation when the etch mask is in contact with the substrate.

FIGS. 6–9 are microscopic cross sections of a copper substrate undergoing liquid phase photochemical etching which depict the function of etch passivation when the etch mask is displaced from the substrate.

DETAILED DESCRIPTION OF THE PREFERRED EMBODIMENTS

In a first preferred embodiment of this invention and with reference to FIG. 1, a pattern is etched into a copper substrate 30 which is immersed in liquid 34 and illuminated with substantially collimated radiation 24 propagating substantially orthogonal to the copper substrate 30 produced by a radiation source 20. Radiation 21 from the radiation source 20 is collimated by collimating optics 22 and the resulting collimated radiation 24 is directed at the copper substrate 30. A window 26 which is a portion of the reaction vessel 28 and which is substantially transparent to the collimated radiation 24 allows the radiated energy to reach the copper substrate 30. An etch mask 32 defines the etched pattern by blocking the radiation at portions of the substrate. The copper substrate 30 and liquid 34 are nominally at a temperature of 25° C. Preferably, the liquid is 0.1% molar concentration hydrochloric acid and the radiation source is a 200 Watt mercury/xenon lamp. At such a temperature and acid concentration and without illumination, copper is not appreciably etched by HCl. Upon illumination by visible/ultraviolet radiation produced by the lamp, however, the etch rate increases substantially.

The etch mask 32 between the radiation source 20 and the substrate 30 is preferably located close to or in contact with the surface to be etched. Such an etch mask 32 may be deposited onto the substrate surface. A mask deposited on the surface need not be opaque. The etch mask 32 is preferably made of patterned chromium or silicon dioxide. In general, any substance may be used which is sufficiently opaque to visible and ultraviolet light such as that produced by the mercury/xenon lamp (e.g. photoresist or chromium) and/or which is not substantially penetrated or etched by the liquid (e.g. silicon nitride). Those areas of the substrate which are both in contact with the solution and illuminated will be subject to etching by the acid solution.

It is believed, in part because of the relatively low power of the light source, that the etching reaction is accelerated in the illuminated areas because of electronic excitation due to photo-irradiation rather than from thermal effects. As used herein, the term "radiation" means radiation at levels above background and this means, for example, illumination at levels substantially greater than room lighting.

A second preferred embodiment of this invention is described with reference to FIGS. 2, 3, 4 and 5, which illustrate anisotropic liquid phase etching of copper with passivation where the etch mask is in contact with the substrate to be etched. FIG. 2 shows a greatly magnified cross section of a copper substrate 30. FIG. 3 shows the surface of the copper substrate partially covered with an etch mask 32. This etch mask may be formed of photoresist by standard photolithographic techniques, or may be any material which is etch resistant (and preferably opaque to the illuminating radiation) which adheres to the surface. FIG. 4 depicts the substrate and etch mask immersed in a liquid 34. The liquid contains one or more etchants and in this embodiment one or more passivants. A passivant is chosen such that it causes the formation of a thin insoluble passivation layer 36 to form on the exposed surface of the substrate. This layer is typically extremely thin (possibly a monolayer); its thickness is greatly exaggerated in the figures for clarity. This insoluble layer prevents the etchant from etching the substrate. Upon illumination with radiation 24, as depicted in FIG. 5, the passivation layer 36 is removed from the substrate 30 and etching proceeds in areas which are illuminated. A substantially vertical sidewall 40 forms, which is protected from etching by the vertical passivation layer 42. This vertical passivation layer 42 is not removed from the sidewall 40 because it is in the shadow of the etch mask 32.

In the second preferred embodiment, above, an etchant is chosen which will etch the substrate (in the absence of a passivation layer) with or without the presence of the illuminating radiation. The passivant is chosen to form a layer on the substrate surface which is removed or partially removed by radiation. Although the mechanism or explanation for this removal is uncertain, it is thought that the passivant bonds to the surface under no illumination, but is detached from the surface and re-enters solution when illuminated. Alternately, the action of a photo-activated or photo-enhanced etchant may prevent the formation of the passivation layer. The passivation layer would form in areas where the etchant action is not activated or enhanced by the radiation.

An important aspect of this preferred embodiment is the automatic passivation of sidewalls as they are formed. As depicted in the figures, sidewalls are created when illuminated areas are removed by etching. The sidewalls are etched only to the point where they are under shadow of the etch mask. The passivation layer then remains on the vertical surface and the sidewall is protected from further etching. Very high etch anisotropy is achieved.

A third preferred embodiment of this invention is described with reference to FIGS. 6, 7, 8 and 9 which illustrate anisotropic liquid phase etching of copper where the etch mask is displaced from the substrate to be etched. FIG. 6 shows a greatly magnified cross section of a copper substrate 30. FIG. 7 shows the surface of the substrate immersed in a liquid 34. Again, the liquid contains one or more etchants and one or more passivants. A passivant is chosen so that it causes the formation of a thin insoluble passivation layer 36. This layer is again typically extremely thin (possibly a monolayer) with its thickness greatly exaggerated in the figures for clarity. This insoluble layer substantially prevents the etchant(s) from etching the substrate. As shown in FIG. 8, an etch mask 32 is positioned above the substrate 30 so that it blocks the collimated radiation 24 at selected portions of the substrate. This etch mask may be any material which is sufficiently opaque to the illuminating radiation, and is not necessarily positioned within the liquid. Upon illumination with radiation, as depicted in FIG. 9, the insoluble passivation layer 36 is removed from the substrate 30 in those areas where the radiation is not blocked by the etch mask 32. With the passivation layer removed, etching of the substrate proceeds in those illuminated areas. Again, a substantially vertical sidewall 40 forms, which is protected from etching by the vertical passivation layer 42. This vertical passivation layer 42 is not removed from the sidewall 40 because it is in the shadow of the etch mask 32.

It should be noted that the etch rate of some liquid etches, such as that described in the first preferred embodiment, may be accelerated by illuminating radiation, thereby exhibiting some anisotropy without passivation. The technique set forth in the second and third preferred embodiments (embodiments making use of passivation) may be used with these photochemical wet etches to further enhance their anisotropy (i.e. increase the ratio of illuminated etch rate to unilluminated etch rate).

In yet other embodiments, the liquid may be from the class of solutions that etch the material without light irradiation. In this case, the radiation accelerates the etch rate on illuminated portions of the substrate (i.e. the etchant is photo-enhanced), resulting in a less isotropic etch. Still other alternate embodiments include liquids containing salts and liquids with pH values less than or equal to seven (i.e. acids and neutral solutions).

In yet another embodiment of this invention, a pattern may be etched into the surface of a copper substrate by projecting a patterned light onto the substrate (e.g. by conventional photo-lithographic techniques).

In still other embodiments of this invention, the liquid may be made to flow with respect to the substrate. The flow rate of the liquid may be varied. The solution temperature can be varied to achieve different etch rates and etch anisotropy. The photon flux (i.e. illumination intensity) may be varied to impact etch directionality and etch rates. The radiation wavelength can be adjusted to achieve different etch directionality and etch rates. The direction of propagation of the radiation need not be normal to the surface. The etch solution 40 may be a mixture of solutions (e.g. one or more passivating agents to enhance anisotropy and one or more reagents to photochemically etch the material).

In an example of the first preferred embodiment of this invention, two samples were prepared by depositing 3,000 Å of copper onto a 2,500 Å thick layer of MoSi$_2$ (a sticking layer) on top of a silicon substrate. A piece of Mylar tape was placed on each sample, bisecting it, with exposed copper on each side of the tape. The tape acted as the etch mask in this example. One sample was placed in a beaker of 0.1% molar HCl. The copper was etched from the sample in 250 minutes. The second sample was placed in a beaker of 0.1% molar HCl with the output of a 200 Watt mercury/xenon ar lamp rendered normal to the copper surface. The copper was etched from exposed areas in only 4 minutes. The illuminated sample exhibited extremely crisp edge definition where the tape prevented illumination.

In an experiment to demonstrate the second preferred embodiment of this invention, copper was anisotropically etched in a liquid containing 0.1% molar concentration hydrochloric acid (the etchant) and 0.019% molar iodine (the passivant). A layer of copper was deposited on a crystalline silicon substrate, and a photoresist etch mask was then formed on the copper. The illuminating radiation was provided by a 200 Watt mercury/xenon lamp, which produces visible/ultraviolet radiation. When the lamp was switched on, the etch proceeded in those areas not covered by photoresist until no copper remained. Essentially no undercut of the photoresist occurred. The same experiment performed with no iodine present in the liquid resulted in severe undercut of the etch mask.

The sole Table, below, provides an overview of some embodiments and the drawing.

TABLE

| FIG. Element | Generic Term | Preferred or Specific Term | Alternate Terms/Function |
|---|---|---|---|
| 20 | Radiation Source | 200 Watt mercury/xenon arc lamp | Metal-halide lamp High pressure sodium lamp black light florescent lamp |
| 21 | Radiation | Visible/UV light | Radiation which will penetrate the liquid; accelerates the etch and/or removes or partially removes passivation layer if present |
| 22 | Collimating Optics | | Collimates radiation from radiation source |
| 24 | Collimated Radiation | Collimated Visible/UV light | Propagates substantially orthogonal to substrate surface |
| 26 | Transparent Window | | Transparent to radiation |
| 28 | Reaction Vessel | | Contains substrate and liquid |
| 30 | Substrate | Copper | |
| 32 | Etch Mask | Silicon dioxide | silicon nitride photoresist noble metals such as platinum Mylar tape |
| 34 | Liquid | 0.1 Molar Hydrochloric acid | Contains etchant(s) or etchant(s) and passivant(s) can be pure water |
| | Etchant | 0.1% molar HCl | Etches substrate in absence of passivation layer; may be photo-activated or photo-enhanced. |
| | Passivant | 0.019% molar I$_2$ | Reacts with substrate to form passivation layer |
| 36 | Passivation layer | CuI, CuI$_2$ | Product of passivant and substrate; removed or partially removed from surface by impinging radiation |
| 40 | Sidewall | | Forms as etch proceeds in illunimated areas |
| 42 | Sidewall passivation layer | CuI, CuI$_2$ | Forms on sidewall under edge of etch mask as etch proceeds; remains because sidewall is in shadow |

A few preferred embodiments have been described in detail hereinabove. It is to be understood that the scope of the invention also comprehends embodiments different from those described, yet within the scope of the claims. For example, the liquid may be acidic, neutral or basic. Salt solutions are contemplated, as well as solutions containing organic solvents. Pure water may be used as an etchant.

Use of the methods described in contemplated in the manufacture of discrete components or fully integrated circuits in silicon, gallium arsenide, or other electronic materials families, as well as in optical-based or other technology-based forms and embodiments.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method to anisotropically etch copper, said method comprising:
    (a) submersing a surface of said copper in a liquid; and
    (b) illuminating portions of said surface with radiation to produce illuminated areas and substantially unilluminated areas of said surface, wherein said illuminated areas are etched at a substantially greater rate than said unilluminated areas.

2. The method according to claim 1, wherein said illuminated areas are at a temperature substantially the same as the temperature of said unilluminated areas.

3. The method according to claim 1, wherein said liquid contains hydrochloric acid.

4. The method according to claim 1, wherein said liquid is $H_2O$.

5. The method according to claim 1, wherein said radiation is produced by a mercury/xenon arc lamp.

6. The method according to claim 1, wherein said copper is on the surface of a VLSI semiconductor substrate.

7. The method according to claim 1, wherein said copper is part of in integrated circuit.

8. The method according to claim 1, wherein the direction of propagation of said radiation is substantially orthogonal to said surface.

9. The method according to claim 1, wherein said liquid is acidic.

10. The method according to claim 1, wherein said liquid is a salt solution.

11. The method according to claim 1, wherein the intensity of said radiation varies with time.

12. The method according to claim 1, wherein said liquid is made to flow with respect to said copper.

13. The method according to claim 1, wherein said radiation is monochromatic.

14. The method according to claim 1, wherein an etch mask is interposed between the source of said radiation and said surface, whereby portions of said surface are not illuminated.

15. The method according to claim 14, wherein said etch mask is comprised of silicon dioxide.

16. The method according to claim 14, wherein said etch mask is comprised of silicon nitride.

17. The method according to claim 14, wherein said etch mask is comprised of one or more noble metals.

18. The method according to claim 14, wherein said etch mask is photoresist.

19. The method according to claim 1, wherein a passivant is added to said liquid, said passivant forming a passivation layer on said surface, said passivation layer being substantially insoluble in said unilluminated areas but substantially removed from said illuminated areas by said radiation, whereby the etch rate in said illuminated areas is substantially greater than the etch rate in said unilluminated areas.

20. The method according to claim 19, wherein said passivant is iodine.

21. The method according to claim 19, wherein said liquid contains hydrochloric acid.

22. A method to etch copper on a VLSI semiconductor substrate, said method comprising submersing said copper in a liquid and illuminating said copper with radiation.

23. A method to anisotropically etch copper on an integrated circuit, said method comprising:
   (a) submersing a surface of said copper in 0.1% molar concentration hydrochloric acid; and
   (b) illuminating portions of said surface with radiation, whereby said illuminated portions of said surface are etched at a substantially greater rate than the unilluminated portions of said surface.

24. The method according to claim 23, wherein 0.019% molar concentration iodine is added to said liquid.

* * * * *